(12) United States Patent
Cheng et al.

(10) Patent No.: US 10,236,214 B2
(45) Date of Patent: Mar. 19, 2019

(54) VERTICAL TRANSISTOR WITH VARIABLE GATE LENGTH

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/196,774

(22) Filed: Jun. 29, 2016

(65) Prior Publication Data

US 2018/0005895 A1  Jan. 4, 2018

(51) Int. Cl.
*H01L 27/00* (2006.01)
*H01L 21/8234* (2006.01)
(Continued)

(52) U.S. Cl.
CPC ........ *H01L 21/823456* (2013.01); *H01L 21/02636* (2013.01); *H01L 21/823418* (2013.01);
(Continued)

(58) Field of Classification Search
CPC ....... H01L 21/82285; H01L 21/823487; H01L 21/823885; H01L 21/823456;
(Continued)

(56) References Cited

U.S. PATENT DOCUMENTS 6,087,692 A * 7/2000 Gobel .................. H01L 27/108
257/300
6,187,094 B1 2/2001 Mitsuhata et al.
(Continued)

OTHER PUBLICATIONS

B. A. Anderson et al., "Variable Gate Lengths for Vertical Transistors," U.S. Appl. No. 14/970,624, filed Dec. 16, 2015. (2015b).
(Continued)

*Primary Examiner* — Hoang-Quan Ho
*Assistant Examiner* — Quovaunda V Jefferson
(74) *Attorney, Agent, or Firm* — Cantor Colburn LLP; Vazken Alexanian

(57) ABSTRACT

A method of forming a vertical transistor includes forming a first pair of fins on a substrate; forming a second pair of fins on the substrate; forming a first trench in the substrate and interposed between each one of the first pair of fins; forming a second trench in the substrate and interposed between each one of the second pair of fins, wherein the second trench is deeper than the first trench; forming a first semiconductor structure interposed between each one of the first pair of fins, the first semiconductor structure having a first gate region interposed between a first source region and a first drain region; and forming a second semiconductor structure interposed between each one of the second pair of fins, the second semiconductor structure having a first gate region interposed between a second source region and a second drain region.

18 Claims, 16 Drawing Sheets

(51) Int. Cl.
*H01L 29/66* (2006.01)
*H01L 21/02* (2006.01)
*H01L 27/088* (2006.01)
*H01L 29/78* (2006.01)
*H01L 29/08* (2006.01)

(52) U.S. Cl.
CPC .... *H01L 21/823487* (2013.01); *H01L 27/088* (2013.01); *H01L 29/0847* (2013.01); *H01L 29/66666* (2013.01); *H01L 29/7827* (2013.01)

(58) Field of Classification Search
CPC ....... H01L 21/823418; H01L 21/02636; H01L 21/088; H01L 21/0847; H01L 29/66666; H01L 29/7827; H01L 29/732; H01L 29/7788; H01L 29/78642; H01L 29/7889
See application file for complete search history.

(56) References Cited

U.S. PATENT DOCUMENTS

| | | | |
|---|---|---|---|
| 6,705,516 B1 | 3/2004 | Kubota | |
| 7,446,025 B2 | 11/2008 | Cohen et al. | |
| 8,653,584 B2 | 2/2014 | Renn | |
| 9,087,897 B1 | 7/2015 | Anderson et al. | |
| 9,299,835 B1 | 3/2016 | Anderson et al. | |
| 2006/0138398 A1* | 6/2006 | Shimamune | H01L 21/02381 257/19 |
| 2008/0157225 A1 | 7/2008 | Datta et al. | |
| 2009/0057780 A1 | 3/2009 | Wong et al. | |
| 2009/0321820 A1* | 12/2009 | Yamakawa | H01L 29/66545 257/330 |
| 2010/0200914 A1* | 8/2010 | Hamada | H01L 29/0856 257/330 |
| 2011/0254086 A1* | 10/2011 | Hsieh | H01L 21/823481 257/330 |
| 2012/0025874 A1* | 2/2012 | Saikaku | H01L 29/1095 327/109 |
| 2015/0236094 A1 | 8/2015 | Hsiao et al. | |
| 2017/0178970 A1 | 6/2017 | Anderson et al. | |
| 2018/0012993 A1 | 1/2018 | Cheng et al. | |

OTHER PUBLICATIONS

B. A. Anderson et al., "Vertical Transistor Fabrication and Devices", U.S. Appl. No. 14/975,168, filed Dec. 18, 2015. (2015a).

J. M. Hergenrother et al., "The vertical replacement-gate (VRG) MOSFET: A 50-nm vertical MOSFET with lithography-independent gate length," International Electron Devices Meeting, 1999, pp. 75-78.

K. Cheng et al., "Fabrication of Vertical Field Effect Transistor Structure With Controlled Gate Length", U.S. Appl. No. 15/087,074, filed Mar. 31, 2016.

Kangguo Cheng et al., "Vertical Transistors Having Improved Gate Length Control", U.S. Appl. No. 15/803,935, filed Nov. 6, 2017.

List of IBM Patents or Patent Applications Treated as Related; (Appendix P), Filed Nov. 22, 2017; 2 pages.

List of IBM Patents or Patent Applications Treated as Related; (Appendix P), Filed Jun. 28, 2018; 2 pages.

Cheng et al., "Vertical Transistors Having Improved Gate Length Control", U.S. Appl. No. 15/681,933, filed Aug. 21, 2017.

Cheng et al., "Vertical Transistors Having Improved Gate Length Control", U.S. Appl. No. 15/803,951, filed Nov. 6, 2017.

* cited by examiner

Section A-A

VERTICAL TRANSISTOR WITH VARIABLE GATE LENGTH

BACKGROUND

The present invention relates in general to semiconductor devices, and more specifically, to vertical-type transistors having variable gate lengths and methods of fabricating the same.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint without compromising necessary FET device performance characteristics.

SUMMARY

According to a non-limiting embodiment, a method of forming a vertical transistor is described. The method includes forming a first pair of fins on a substrate; forming a second pair of fins on the substrate; forming a first trench in the substrate and interposed between each one of the first pair of fins; forming a second trench in the substrate and interposed between each one of the second pair of fins, wherein the second trench is deeper than the first trench; forming a first semiconductor structure interposed between each one of the first pair of fins, the first semiconductor structure having a first gate region interposed between a first source region and a first drain region; and forming a second semiconductor structure interposed between each one of the second pair of fins, the second semiconductor structure having a first gate region interposed between a second source region and a second drain region.

According to a non-limiting embodiment of the present invention, a vertical transistor includes a first pair of fins on a substrate; a second pair of fins on the substrate; a first trench in the substrate and interposed between each one of the first pair of fins; a second trench in the substrate and interposed between each one of the second pair of fins, wherein the second trench is deeper than the first trench; a first semiconductor structure interposed between one of the first pair of fins, the first semiconductor structure having a first gate region interposed between a first source region and a first drain region; and a second semiconductor structure interposed between each one of the second pair of fins, the second semiconductor structure having a first gate region interposed between a second source region and a second drain region.

Additional features are realized through the techniques of embodiments of the present invention. Other embodiments are described in detail herein and are considered a part of the claimed invention. For a better understanding of embodiments, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of embodiments of the invention are apparent from the following detailed description taken in conjunction with non-limiting embodiments illustrated in the accompanying drawings. FIGS. 1-16 are a series of views illustrating a vertical FET device and a method of forming a vertical FET device according to exemplary embodiments of the present teachings, in which:

FIG. 1 is a cross-sectional view of a starting semiconductor structure having a semiconductor substrate according to a non-limiting embodiment;

FIG. 2 illustrates the semiconductor structure of FIG. 1 after patterning hardmasks on an upper surface of the semiconductor substrate according to a non-limiting embodiment;

FIG. 3 illustrates the semiconductor structure of FIG. 2 after performing an etching process to transfer patterned trenches into the semiconductor substrate according to a non-limiting embodiment;

FIG. 4 illustrates the semiconductor structure of FIG. 3 having a short region protected by a patterned organic polarization layer (OPL) and a long region having further etching according to a non-limiting embodiment;

FIG. 5 illustrates the semiconductor structure of FIG. 4 after undergoing an OPL striping process, and a patterned etching process to form deep trenches in between device regions according to a non-limiting embodiment;

FIG. 6 illustrates the semiconductor structure of FIG. 5 having dielectric material deposited over the entire structure and planarized up to the top of hardmasks according to a non-limiting embodiment;

FIG. 7 illustrates a top view of the semiconductor structure of FIG. 6 after etching the inner trenches with an etching process according to a non-limiting embodiment;

FIG. 8 illustrates a section view of the semiconductor structure shown in FIG. 7 taken along line A-A in FIG. 7;

FIG. 9 illustrates the semiconductor structure of FIG. 8 following an epitaxial growth of a doped semiconductor layer in the inner trenches according to a non-limiting embodiment;

FIG. 10 illustrates the semiconductor structure of FIG. 9 following a directional deposition of a dielectric layer according to a non-limiting embodiment;

FIG. 11 illustrates the semiconductor structure of FIG. 10 after depositing the gate stack (including the gate dielectrics and metals) that fills the inner trenches, and planarizing the entire structure till the top of hardmasks according to a non-limiting embodiment;

FIG. 12 illustrates the semiconductor structure of FIG. 11 following a selective etching process that etches a portion of the gate stack according to a non-limiting embodiment;

FIG. 13 illustrates the semiconductor structure of FIG. 12 after the directional deposition of a dielectric layer on top of the gate, the dielectric material between inner trenches, and the hardmasks according to a non-limiting embodiment;

FIG. 14 illustrates the semiconductor structure of FIG. 13 after depositing a sacrificial dielectric layer in the cavities in FIG. 12;

FIG. 15 illustrates the semiconductor structure of FIG. 14 after selective etching of the sacrificial dielectric layer and hardmasks to expose the top portion of fins according to a non-limiting embodiment; and FIG. 16 illustrates the semiconductor structure of FIG. 15 after deposition of a doped semiconductor layer in the cavity formed by the selective etching of FIG. 15.

DETAILED DESCRIPTION

Figure 1:
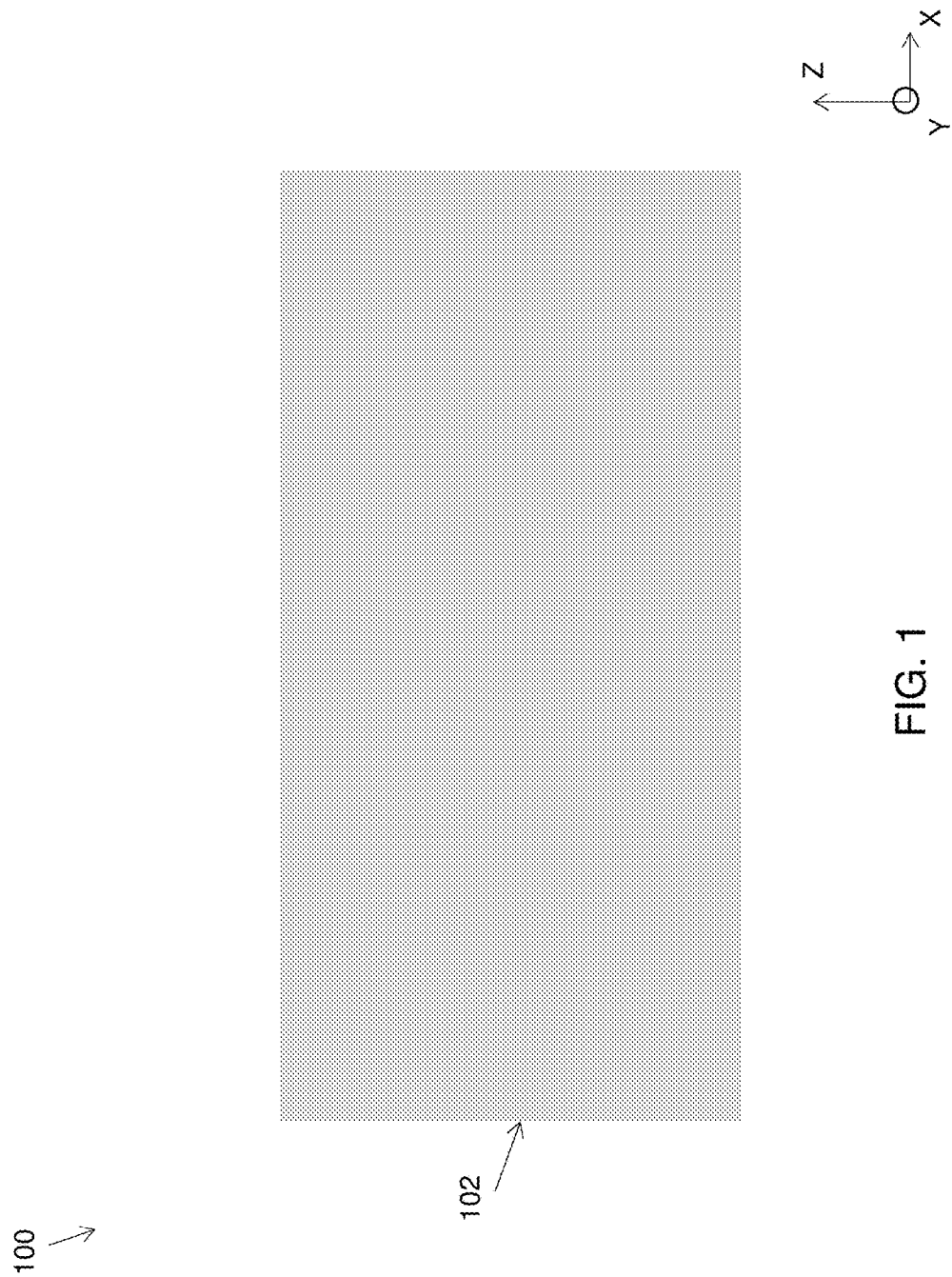

Various embodiments of the present invention are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the embodiments of the present invention are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments will now be provided. Although specific fabrication operations used in implementing one or more embodiments may be individually known, the disclosed combination of operations and/or resulting structures are unique. Thus, the unique combination of the operations described in connection with the fabrication of a coupler system utilize a variety of individually known physical and chemical processes performed on a semiconductor (e.g., silicon) substrate. In general, the various processes used to form a micro-chip that will be packaged into an IC fall into three categories, namely, film deposition, patterning, etching, and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to an overview, as previously noted herein, vertical-type transistors such as vertical FETs have recently been developed to achieve a reduced FET device footprint without compromising necessary FET device performance characteristics. A vertical FET has a channel perpendicular to the substrate surface as opposed to a conventional FET, which has a channel extending substantially parallel to the substrate surface. By forming the channel substantially perpendicular to the substrate surface, vertical FETs improve the device density beyond FET devices that have their channels positioned substantially parallel to the substrate surface. In known techniques for forming vertical FETS, the gate regions are formed having uniform length. Embodiments of the present disclosure provide fabrication techniques for forming vertical FETS having different gate lengths and uniform source/drain (S/D) lengths.

Turning now to a more detailed description of one or more embodiments, with reference to FIG. 1, a starting semiconductor structure 100 for fabricating a vertical-type semiconductor device such as a vertical FET, for example, is illustrated according to a non-limiting embodiment. The starting semiconductor structure 100 extends along a first axis (e.g., a Z-axis) to define a vertical height, a second axis (e.g., an X-axis) to define a distance of a first side (i.e., a first side distance). A Y-axis arrow extends into the page, as shown in FIG. 1.

The starting semiconductor structure 100 includes a semiconductor substrate 102. The semiconductor substrate 102 may include a bulk semiconductor substrate or a semiconductor-on-insulator (SOI) substrate as understood by one of ordinary skill in the art. In one non-limiting embodiment, the material of the semiconductor substrate is silicon (Si). Other semiconductor substrates are also conceived. The semiconductor substrate 102 may comprise other structures (not shown) such as isolation, doped wells that can be formed by techniques well known in the art.

Figure 2:
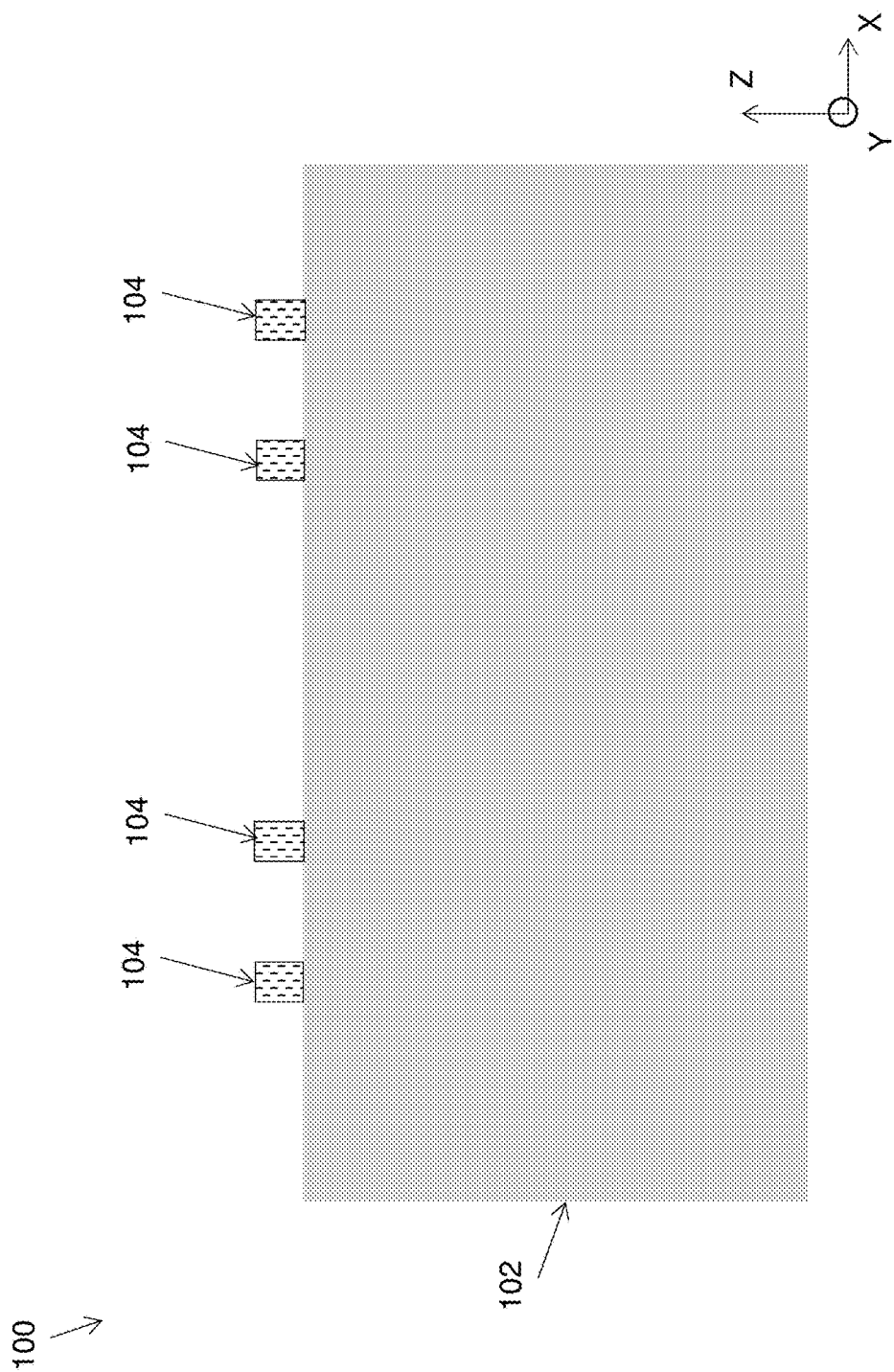

Referring now to FIG. 2, the semiconductor structure 100 is illustrated after patterning and forming hardmasks 104 on an upper surface of the semiconductor substrate 102. The hardmasks 104 are formed by forming a masking layer on the upper surface of the semiconductor substrate 102. The masking layer may include a photosensitive material that is deposited using, for example, a spin coating process followed by photolithography. The masking layer may be, for example, a nitride hardmask. Alternatively, the masking layer may include a hardmask layer such as amorphous carbon.

Figure 3:
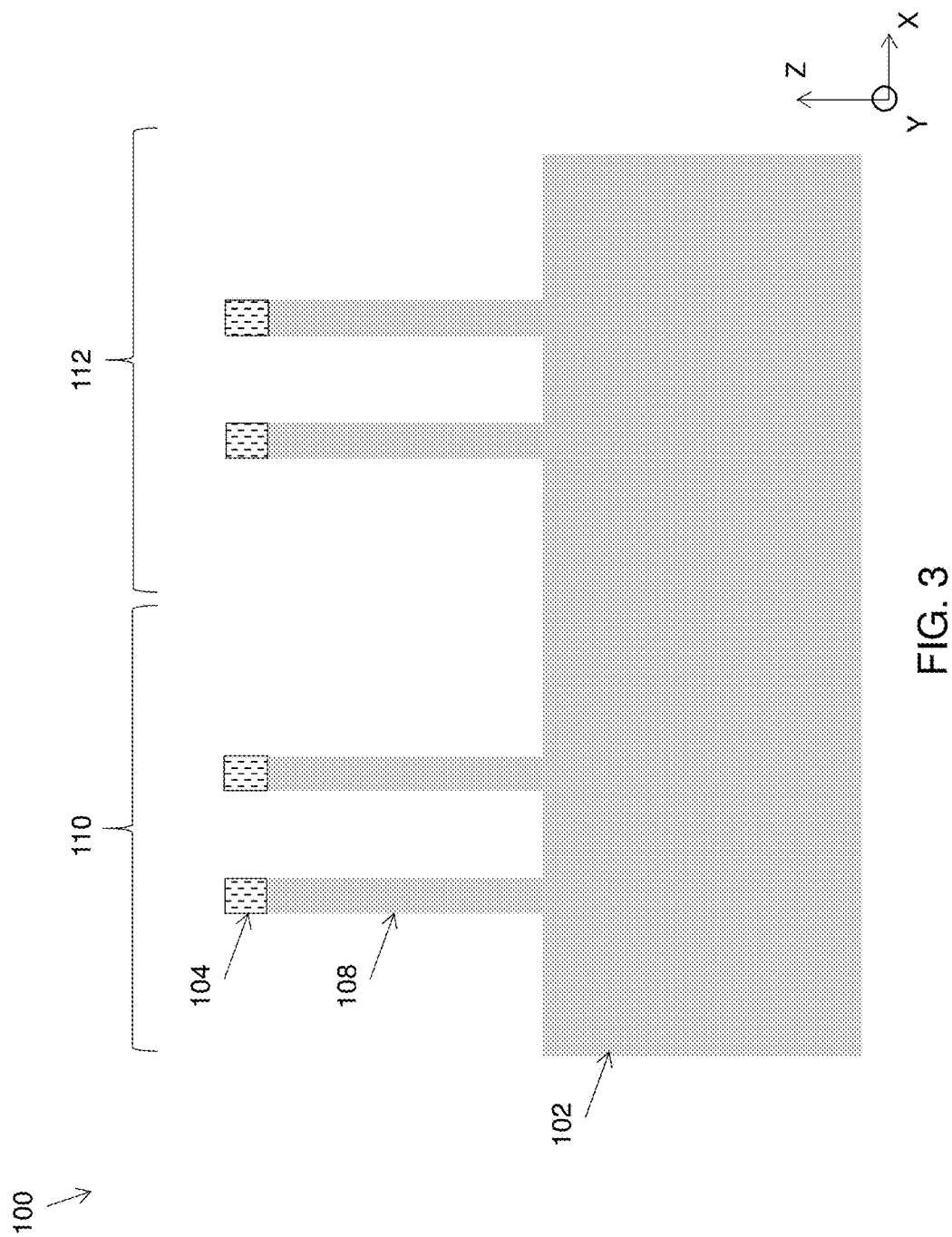

FIG. 3 illustrates the semiconductor structure of FIG. 2 after performing an etching process to transfer patterned trenches into the semiconductor substrate according, to a non-limiting embodiment. Referring now to FIG. 3, an etch is applied to the semiconductor structure 100 to etch into the portions of the semiconductor substrate 102 that are not covered by the hardmasks 104, thereby forming fins 108. In one non-limiting embodiment, a single etching process selective to a substrate material may be used to etch around the hardmasks 104 while stopping at a predetermined depth. Although four fins 108 are shown, it should be appreciated that any number of fins are contemplated.

According to one or more embodiments, semiconductor structure 100 is configured to have separate regions. For example, FIG. 3 depicts a short region 110 and a long region 112. According to one or more embodiments, vertical FET devices formed in the long gate region 112 will be configured, using processing operations described herein, to have a longer gate than the gate of vertical FET devices formed in the short region 110. According to one or more embodiments, in addition to semiconductor structure 100 being configured to include two separate gate regions (e.g., short region 110 and long region 112) where each region has different gate thickness (Lg), the source/drain (S/D) thickness between both regions is uniform.

Figure 4:
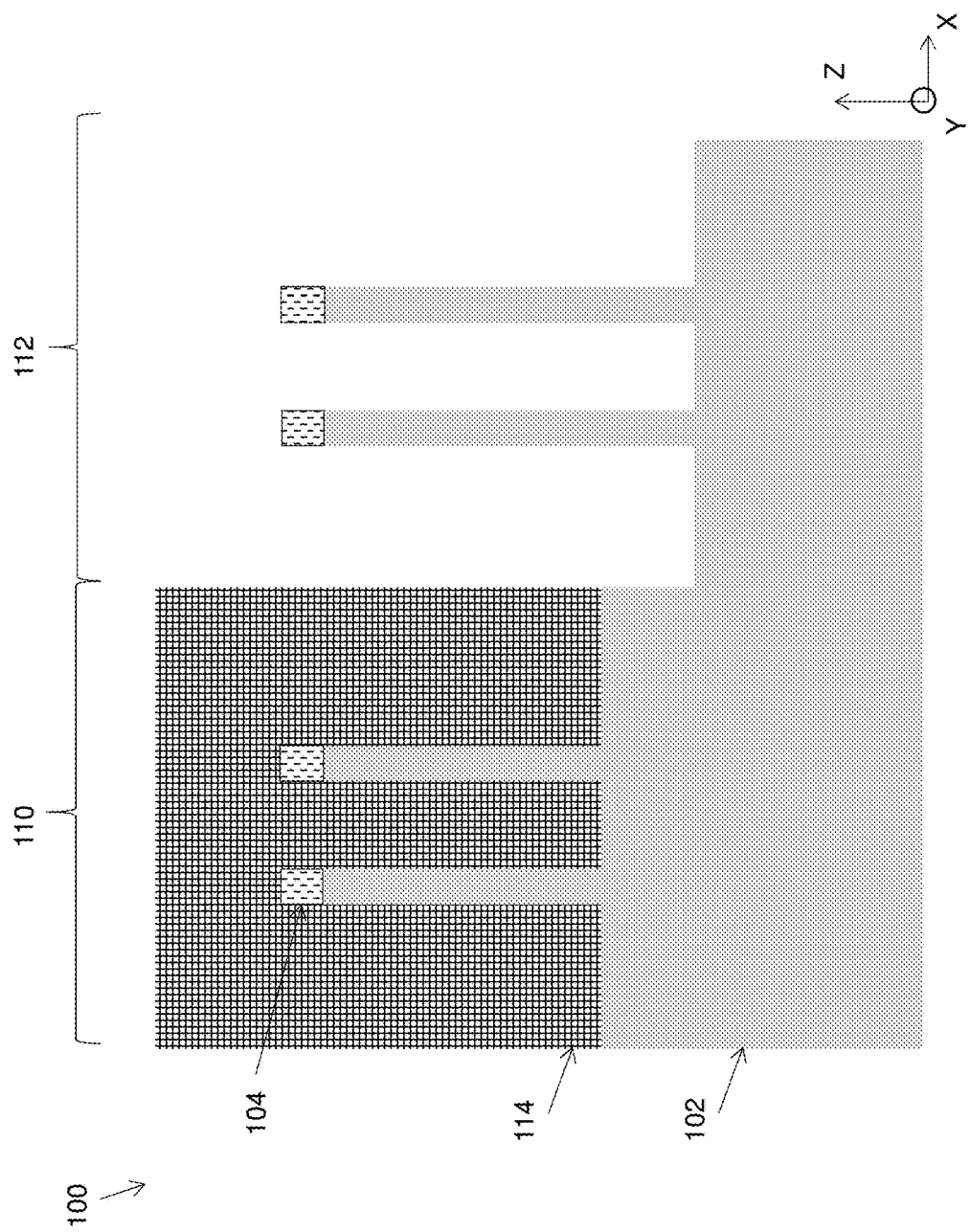

As shown in FIG. 4, an organic planarization layer (OPL) photoresist mask 114 is applied over semiconductor substrate 102, fins 108 and hardmasks 104 in short region 110. Thereafter, a separate etching process selective to semiconductor substrate 102 is performed. The OPL photoresist mask 114 allows further etching of the semiconductor substrate in the long region 112, which results in the fins 108 in the long region 112 being longer than the fins 108 in the short region 110 and allows for a thicker gate with respect to the gate in short region 110.

Figure 5:
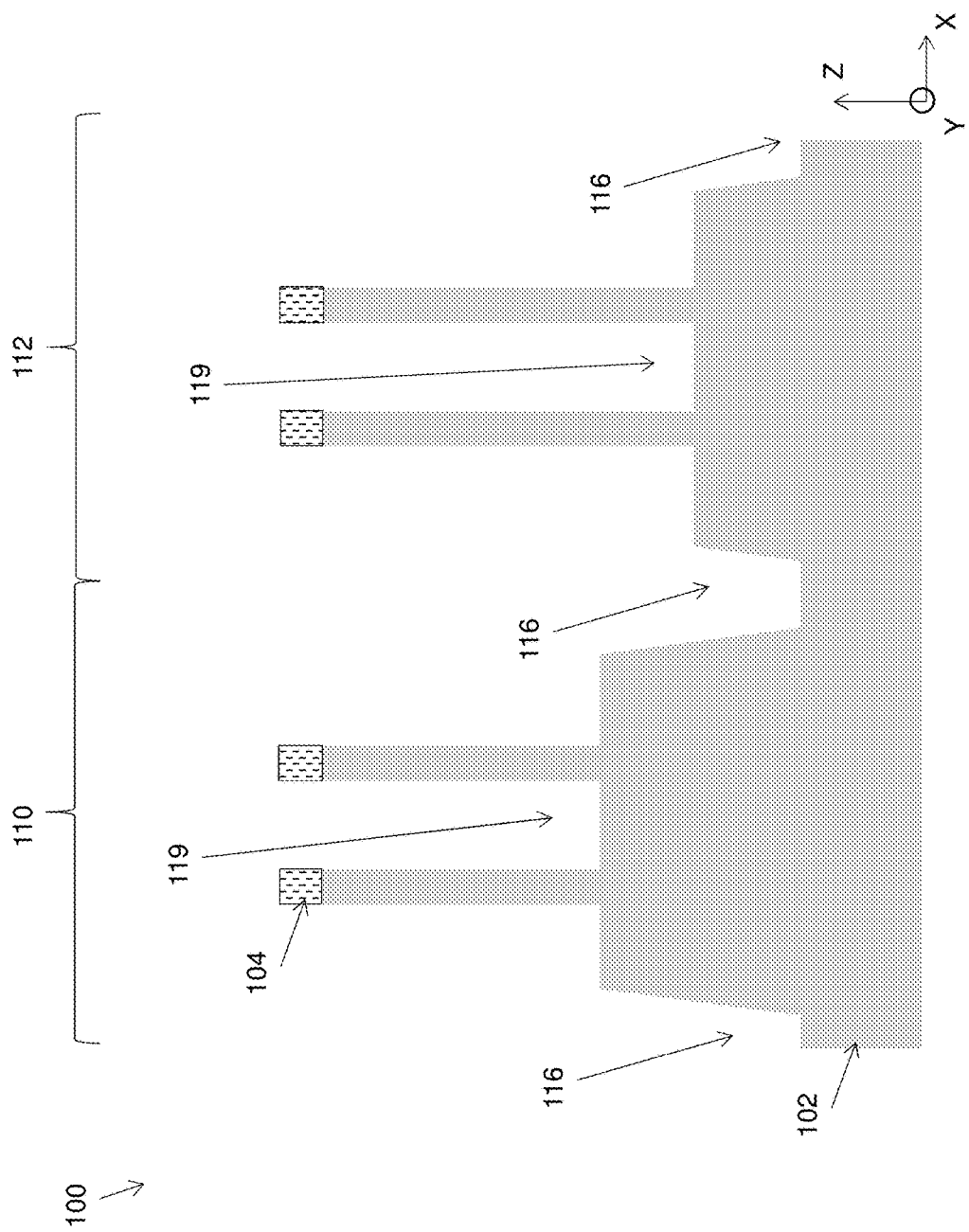

FIG. 5 illustrates the semiconductor structure of FIG. 4 after undergoing an OPL striping process, a patterned etching process to form deep trenches in between device regions, according to a non-limiting embodiment. As shown in FIG. 5, trenches 116 may be etched in semiconductor structure 100 to isolate the different device regions.

Figure 6:
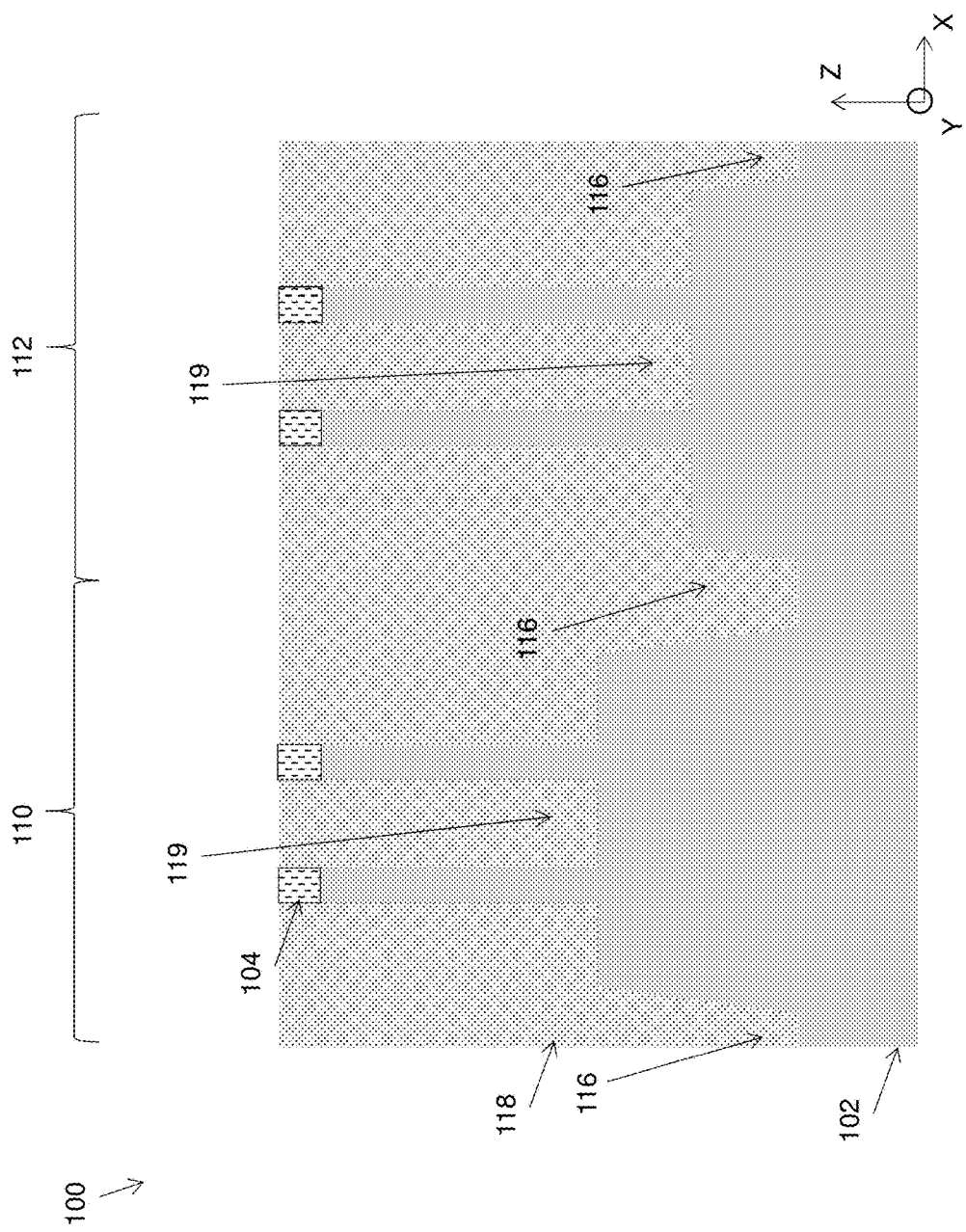

As shown in FIG. 6, a dielectric material 118 (such as silicon dioxide) is deposited to fill the entire structure (including deep trenches 116 and inner trenches 119). Dielectric material 118 is then recessed down to the hardmasks 104 using a technique such as chemical-mechanical planarization (CMP). The planarization is performed, at least, to the top surface of the hardmasks 104, exposing a distal surface of the hardmasks 104.

Figure 7:
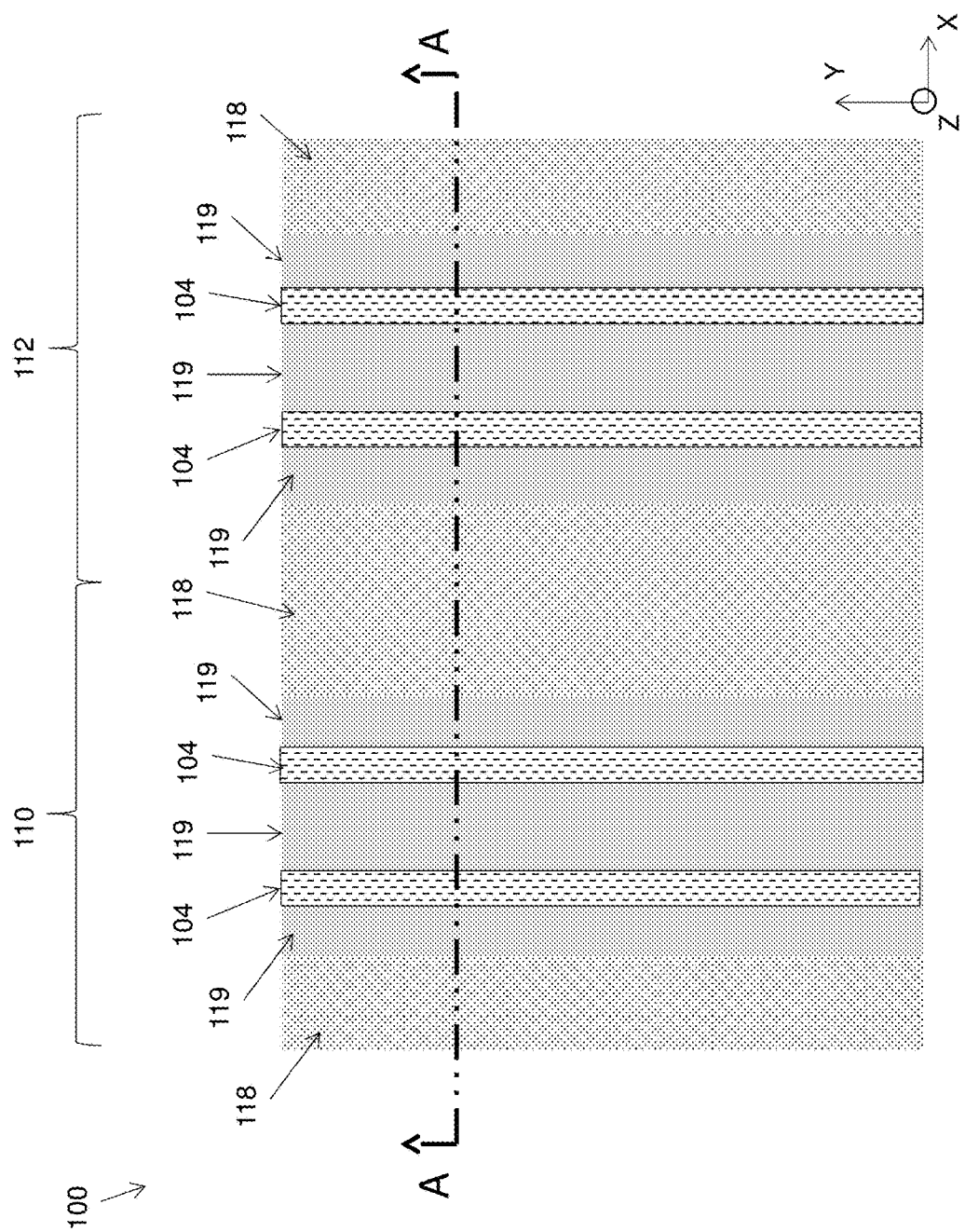
Figure 8:
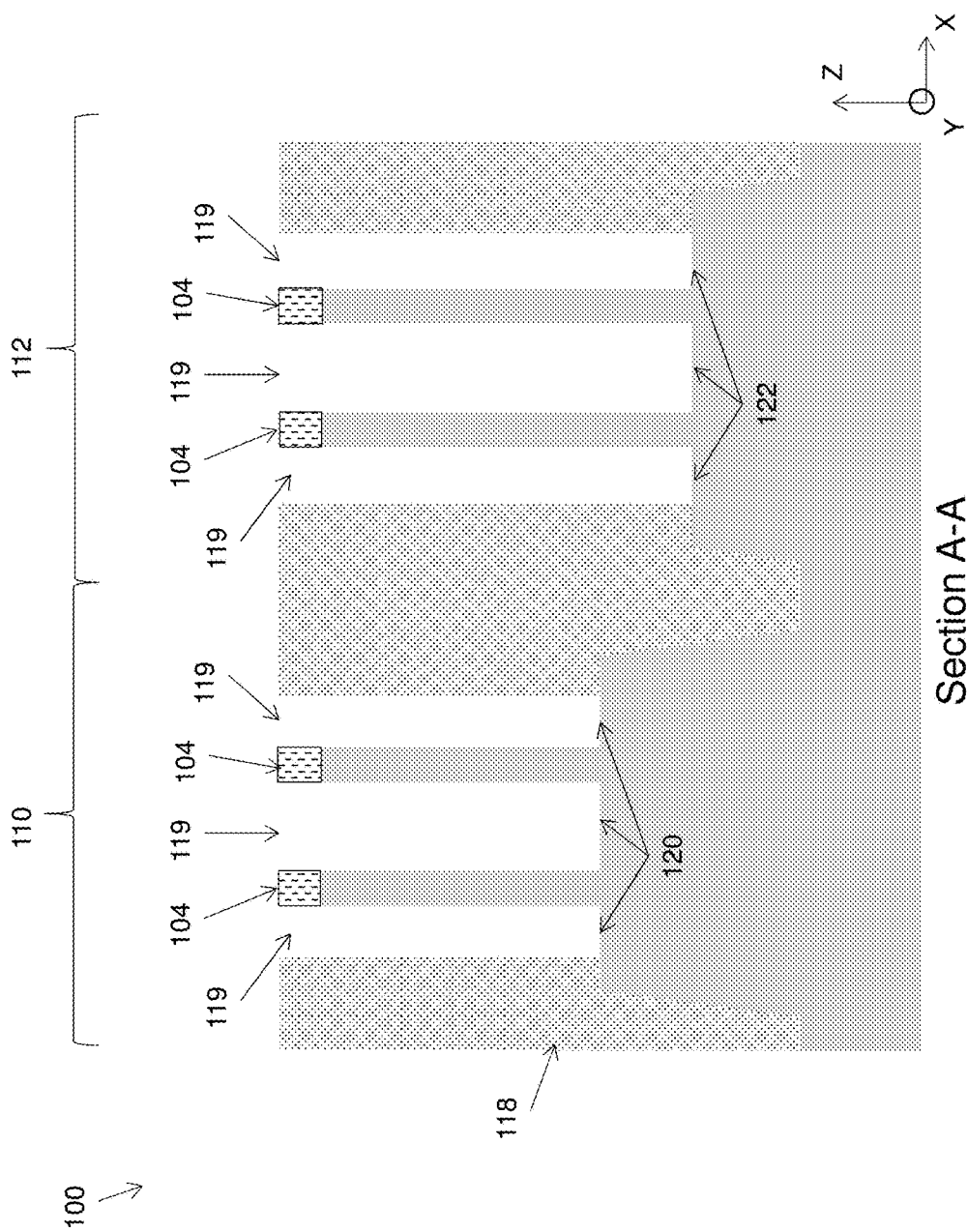

FIG. 7 depicts a top view of semiconductor structure 100, where portions of semiconductor substrate 102 have been exposed by a pattern and selective etching technique to reopen inner trenches 119 around each of the fins 108. FIG. 8 depicts a section view of the semiconductor substrate 100 shown in FIG. 7 taken along line A-A shown in FIG. 7. As best shown in FIG. 8, after patterning, a second etching process such as, for example, a reactive ion etching (RIE) process selective to dielectric material 118 is performed. In short region 110, the etching process stops on a semiconductor substrate surface 120. In the long region 112, the etching process stops on a semiconductor substrate surface 122.

Figure 9:
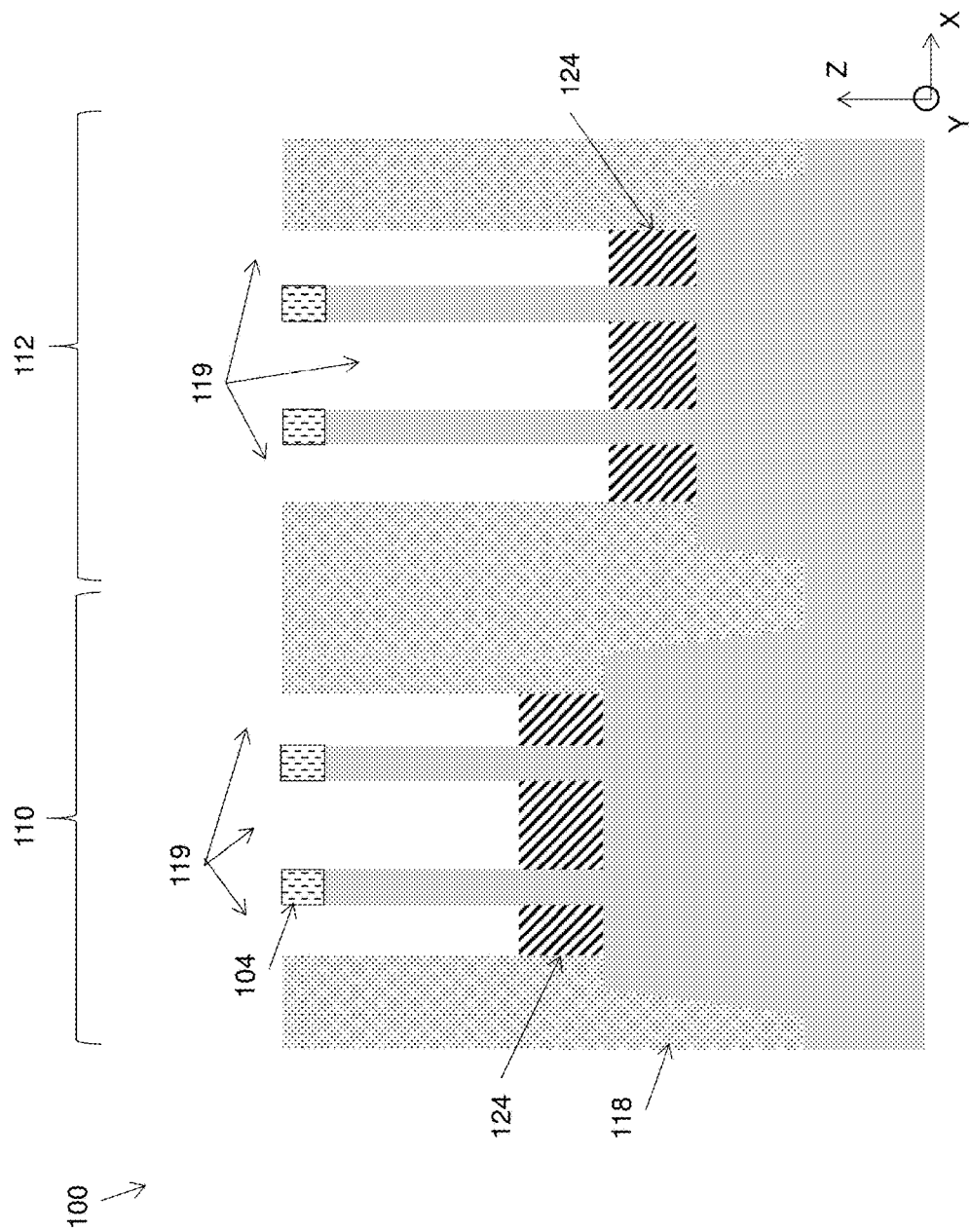

As shown in FIG. 9, after reopening inner trenches 119 and exposing substrate surfaces 120 and 122 using the second etching process, bottom S/D regions are epitaxially grown by forming doped semiconductor layers 124 within inner trenches 119 and on substrate surfaces 120 and 122. By using epitaxial growth, doped semiconductor layers 124 having substantially the same thickness can be formed on any topology, regardless of whether the surfaces on which the doped semiconductor layers 124 are grown are coplanar. Accordingly, the doped semiconductor layers 124 epitaxially grown in the inner trenches 119 of the short region 110 and the long region 112 have substantially the same thickness although surfaces 120 and 122 are not coplanar. In one non-limiting embodiment, doped semiconductor layer 124 may have a vertical thickness ranging, for example, from approximately 10 nm to approximately 80 nm. Various epitaxial growth processes may be used to grow the doped semiconductor layer 124. For example, the doped semiconductor layer 124 may be epitaxially grown using chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The doped semiconductor layers 124 serve as bottom S/D regions 124, which are located over the semiconductor substrate 102. The semiconductor layers 124 may be doped using any suitable doping technique such as ion implantation, plasma doping, in-situ doped epitaxy growth, solid phase doping, liquid phase doping, gas phase doping, etc. In some embodiments, a thermal anneal is performed after doping in order to activate the dopants. In some embodiments, the thermal anneal step is skipped. In some embodiments, the doped semiconductor layers 124 may have the same material as the substrate 102 or different material from the substrate 102. For example, the doped semiconductor layers 124 can be silicon germanium or silicon doped with p-type dopants such as boron, gallium, indium for p-type transistors. The doped semiconductor layer 124 can be silicon germanium or silicon doped with n-type dopants such as phosphorus, arsenic, antimony for n-type transistors.

Figure 10:
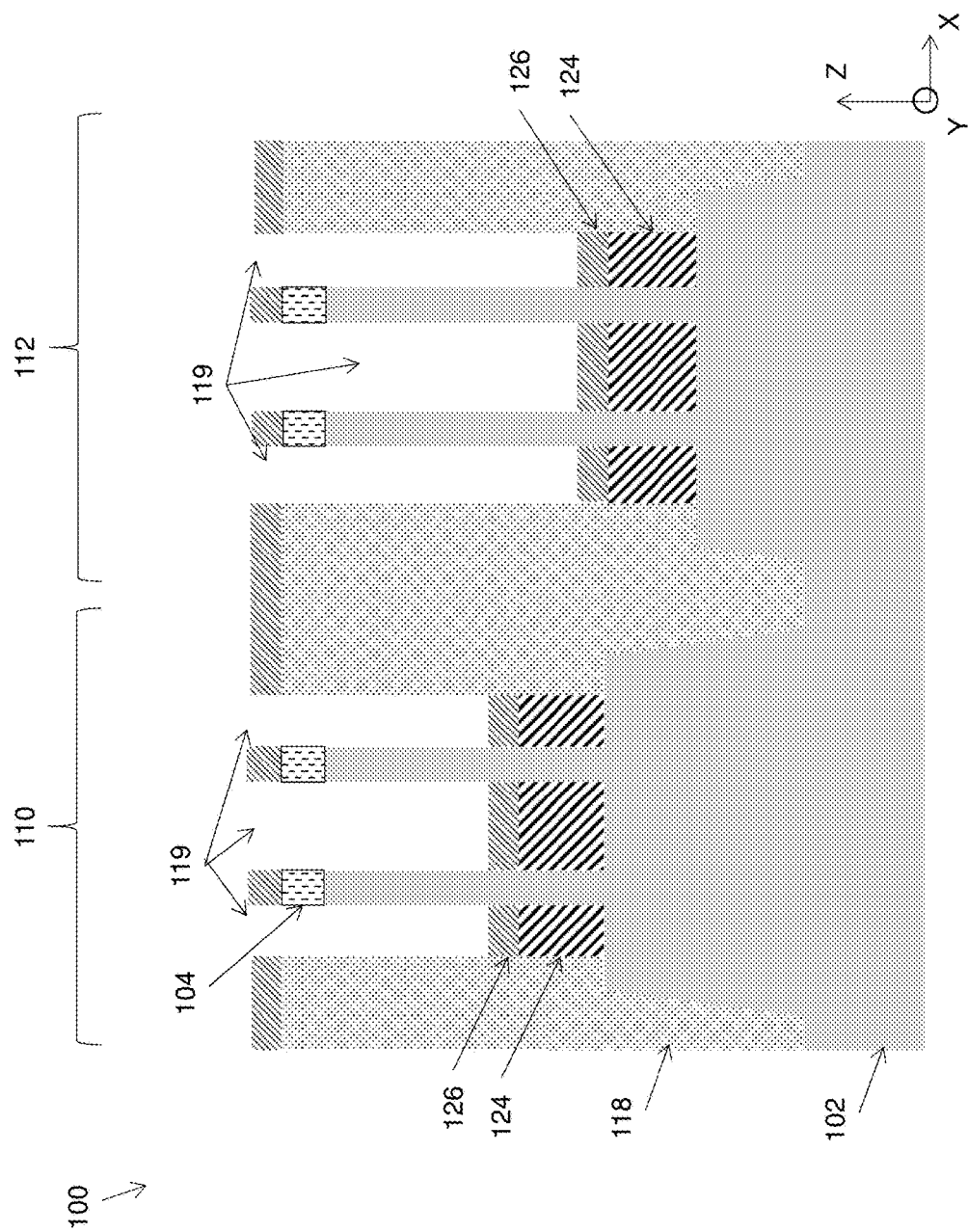

As shown in FIG. 10, one or more dielectric layer 126 are formed over the dielectric material 118, the S/D regions 124, and the hard masks 104 using, for example, a directional deposition method such as gas clustering ion beam (GCIB) or high density plasma (HDP). The dielectric layers 126 comprise a dielectric material that may or may not have the capability of diffusing its local dopants in response to a thermal anneal process. The portions of the dielectric layers 126 that are over S/D regions 124 may also serve as lower spacers that protect the S/D regions 124 during subsequent fabrication processes discussed in greater detail below.

The dielectric layers 126, which include lower spacers 126 located above S/D regions 124, may comprise a doped-dielectric material capable of diffusing its local dopants in response to a thermal anneal process. The dopant source material of the dielectric layers 126 may be any suitable material containing dopants such as arsenic (As), phosphorous (P), antimony (Sb) for an n-type transistor, or, in the event of a p-type transistor is desired, boron (B), gallium (Ga). In one non-limiting embodiment, the dielectric layers 126 comprise an n-type doped dielectric material such as, for example, arsenic-doped silicate glass (ASG), phosphorus doped silicate glass (PSG), phosphorus oxide (e.g., $P_2O_5$), or arsenic oxide (e.g., $As_2O_3$). In one non-limiting embodiment, the dielectric layers 126 comprise a p-type doped dielectric material such as, for example, boron-doped silicate glass (BSG), boron oxide (e.g., $B_2O_3$). Other suitable dopant source materials are also suitable. The dielectric layers 126 may be deposited by a chemical vapor deposition (CVD) process, such as low pressure chemical vapor deposition (LPCVD), GCIB, high density plasma chemical vapor deposition (HDP-CVD), plasma enhanced chemical vapor deposition (PECVD), or atomic layer deposition (ALD), etc.

The vertical thickness of the lower spacers 126 can range, for example, from approximately 2 nm to approximately 20 nm. Other thickness is also conceived. If the dielectric layers 126 comprise a doped-dielectric material, the dopant concentration in the dielectric layers 126 ranges from $1E19/cm^3$ to $5E21/cm^3$, although lower or higher dopant concentration is also suitable.

Figure 11:
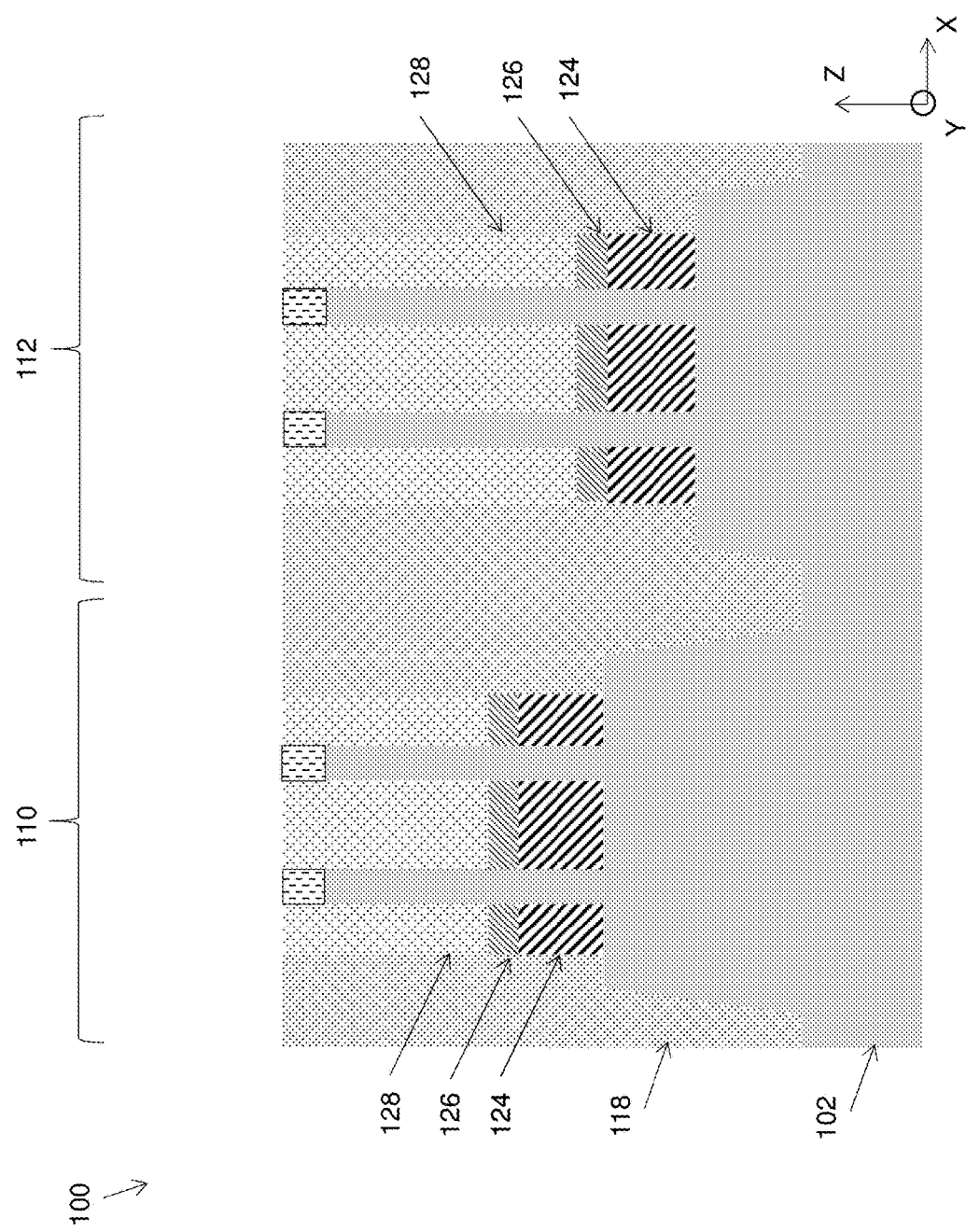

As shown in FIG. 11, a gate stack 128 (including the gate dielectrics and metals) is filled in the inner trenches. Then the entire structure is planarized via the CMP process which stops on top of the hardmasks 104 and removes the dielectric layers 126 over the dielectric material 118 and the hard masks 104 (leaving lower spacers 126). According to a non-limiting embodiment, a conformal deposition process may first be performed to deposit gate dielectrics within inner trenches 119 and over the lower spacers 126. The gate dielectrics may be, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In one non-limiting embodiment, the gate stack 128 includes a thin layer of hafnium oxide ($HfO_2$) having a thickness ranging from approximately 1.5 nm to approximately 10 nm. Another conformal deposition process may then be performed to deposit gate metals within inner trenches 119 and over the gate dielectrics. The gate metals include work-function metals such as titanium nitride, titanium carbide, titanium aluminum carbide, tantalum nitride and tantalum carbide; and conducting metals such as tungsten, aluminum, copper and poly-silicon.

Figure 12:
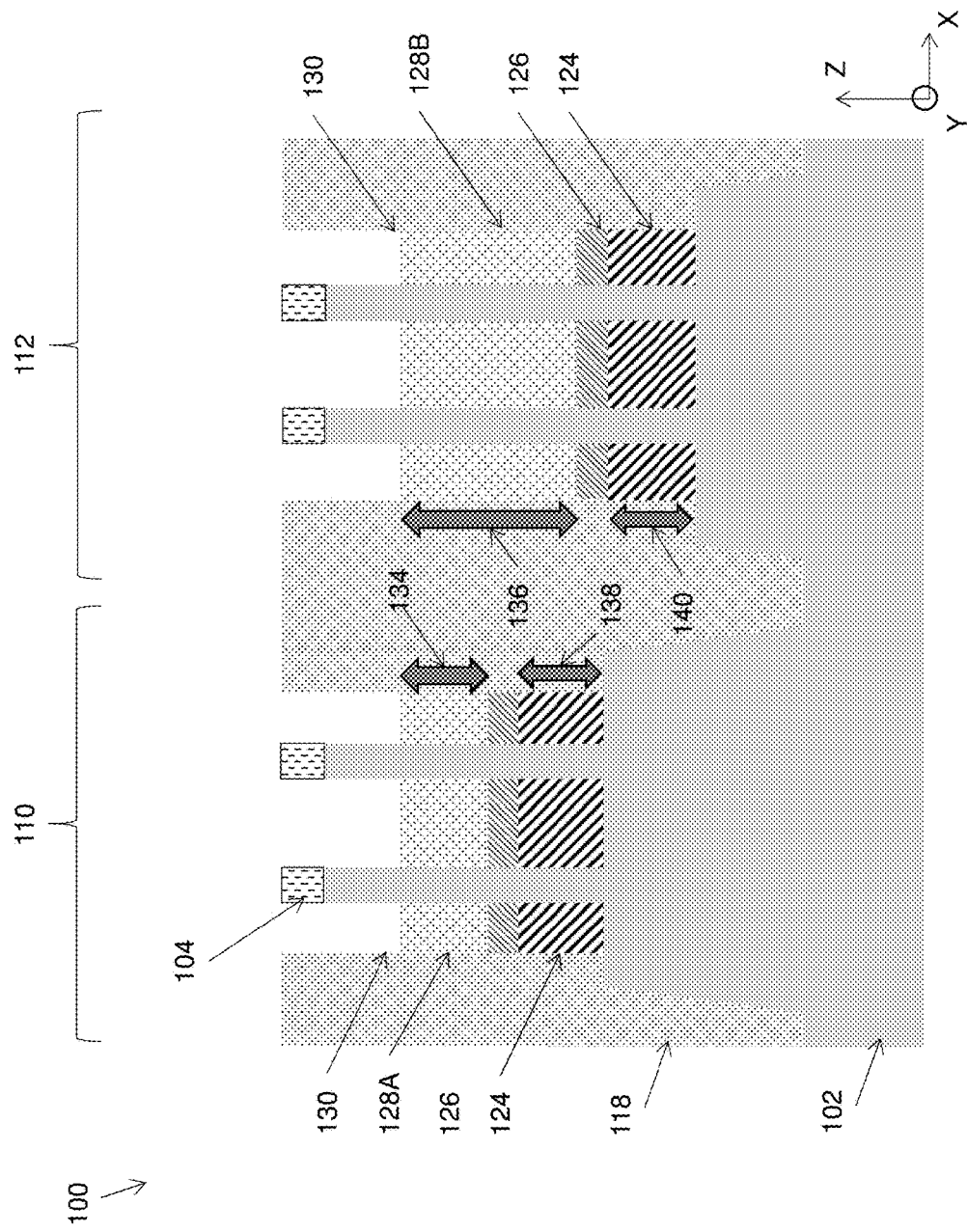

As shown in FIG. 12, the semiconductor structure 100 is patterned, and the gate stack 128 within both the long region 112 and the short region 110 is etched to a predetermined depth, which results in a gate stack 128A having a gate height 134, as well as a gate stack 128B having a gate height 136. The gate stack 134 is shorter than the gate stack 136.

Figure 13:
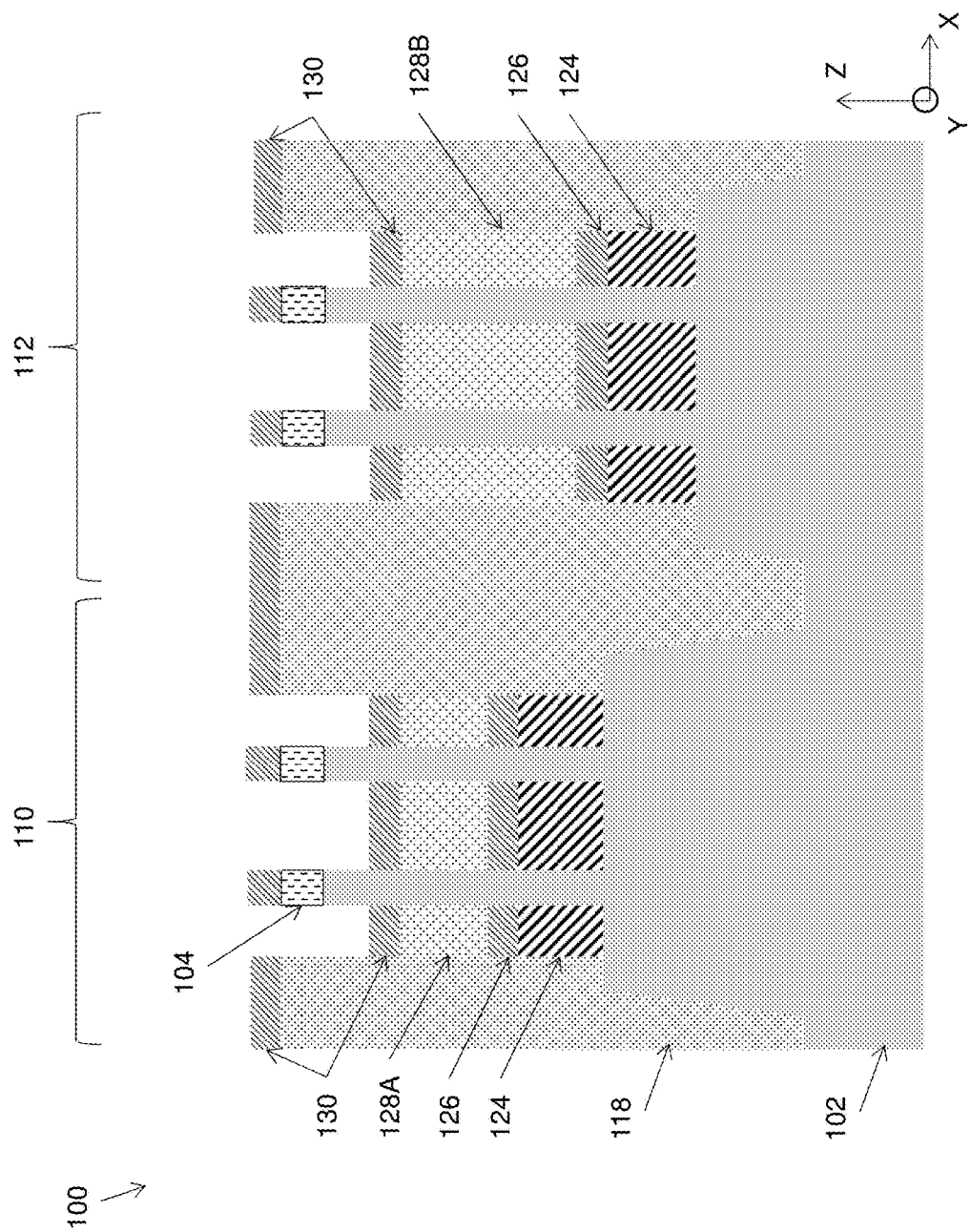

As shown in FIG. 13, dielectric layers 130 are formed over the dielectric material 118, the gate stacks 128A, 128B, and the hard masks 104 using, for example, a directional deposition method such as GCIB or HDP. The dielectric layers 130 have similar properties with the dielectric layers 126. The portions of the dielectric layers 130 that are over gate stacks 128A, 128B may also serve as upper spacers that protect the gate stacks 128A, 128B during subsequent fabrication processes discussed in greater detail below.

The dielectric layers 130, which include upper spacers 130 located above gate stacks 128A, 128B, may comprise a doped-dielectric material capable of diffusing its local dopants in response to a thermal anneal process. The dielectric material of the dielectric layers 130 may be any suitable material containing dopants such as arsenic (As), phosphorous (P), antimony (Sb) for an n-type transistor, or, in the event of a p-type transistor is desired, boron (B), gallium (Ga). In one non-limiting embodiment, the dielectric layers 130 comprise an n-type doped dielectric material such as, for example, arsenic-doped silicate glass (ASG), phosphorus doped silicate glass (PSG), phosphorus oxide (e.g., $P_2O_5$), or arsenic oxide (e.g., $As_2O_5$). In one non-limiting embodiment, the dielectric layers 130 comprise a p-type doped dielectric material such as, for example, boron-doped silicate glass (BSG), boron oxide (e.g., $B_2O_3$). Other suitable dopant source materials are also suitable. The dielectric layers 130 may be deposited by a CVD process such as LPCVD, GCIB, HDP-CVD, PECVD, or ALD, etc.

The vertical thickness of the upper spacers 130 can range, for example, from approximately 2 nm to approximately 20 nm. Other thickness is also conceived. If the dielectric layers 130 comprise a doped-dielectric material, the dopant concentration in the dielectric layers 130 ranges from $1E19/cm^3$ to $5E21/cm^3$, although lower or higher dopant concentration is also suitable.

Figure 14:
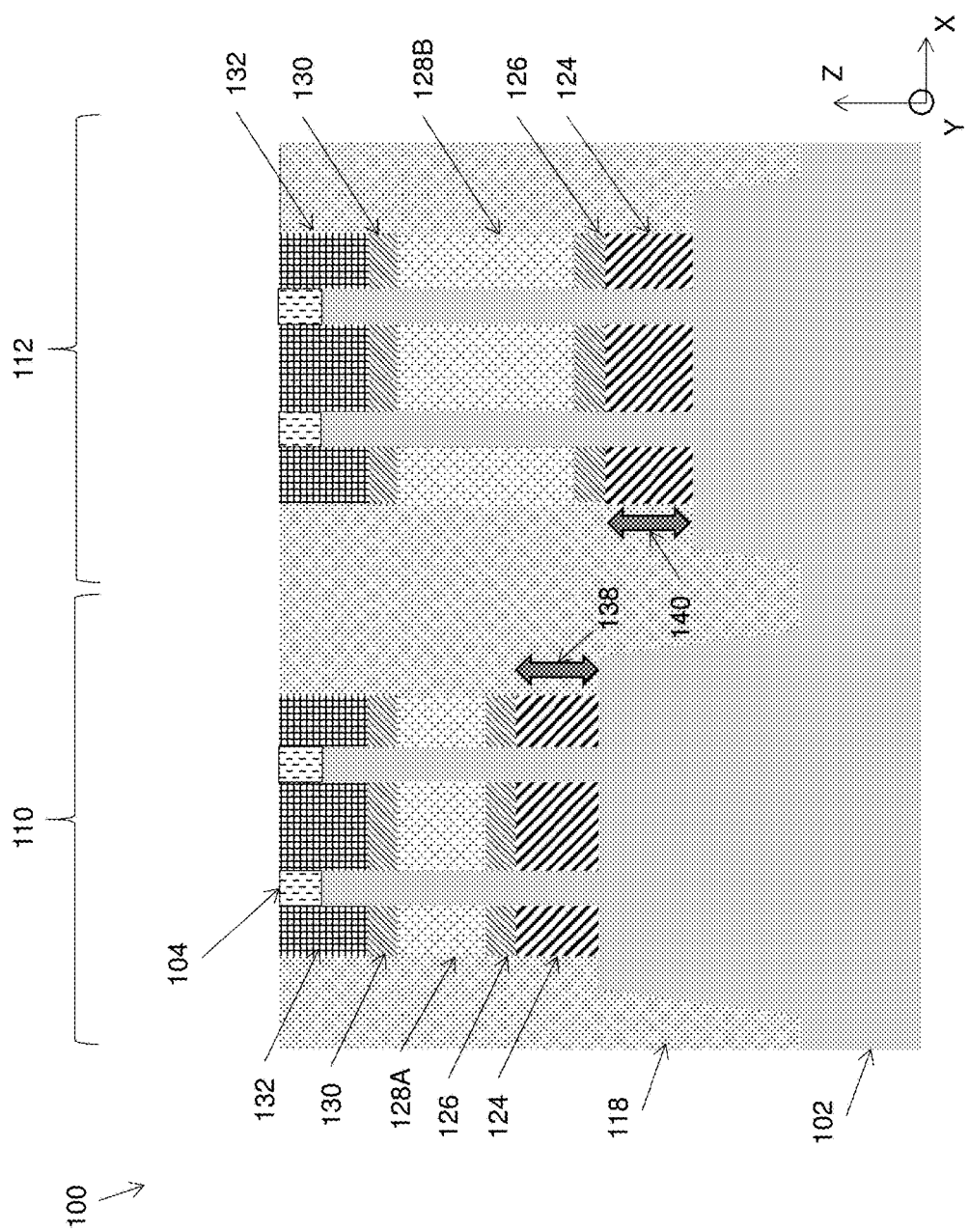

As shown in FIG. 14, a sacrificial dielectric layer 132 is filled in the cavities as shown in FIG. 13. Then the entire structure is planarized via the CMP process which stops on top of the hardmasks 104 and removes the portions of dielectric layers 130 over the dielectric material 118 and the hard masks 104 (leaving upper spacers 130). In some embodiments, sacrificial dielectric layer 132 may be OPL.

Figure 15:
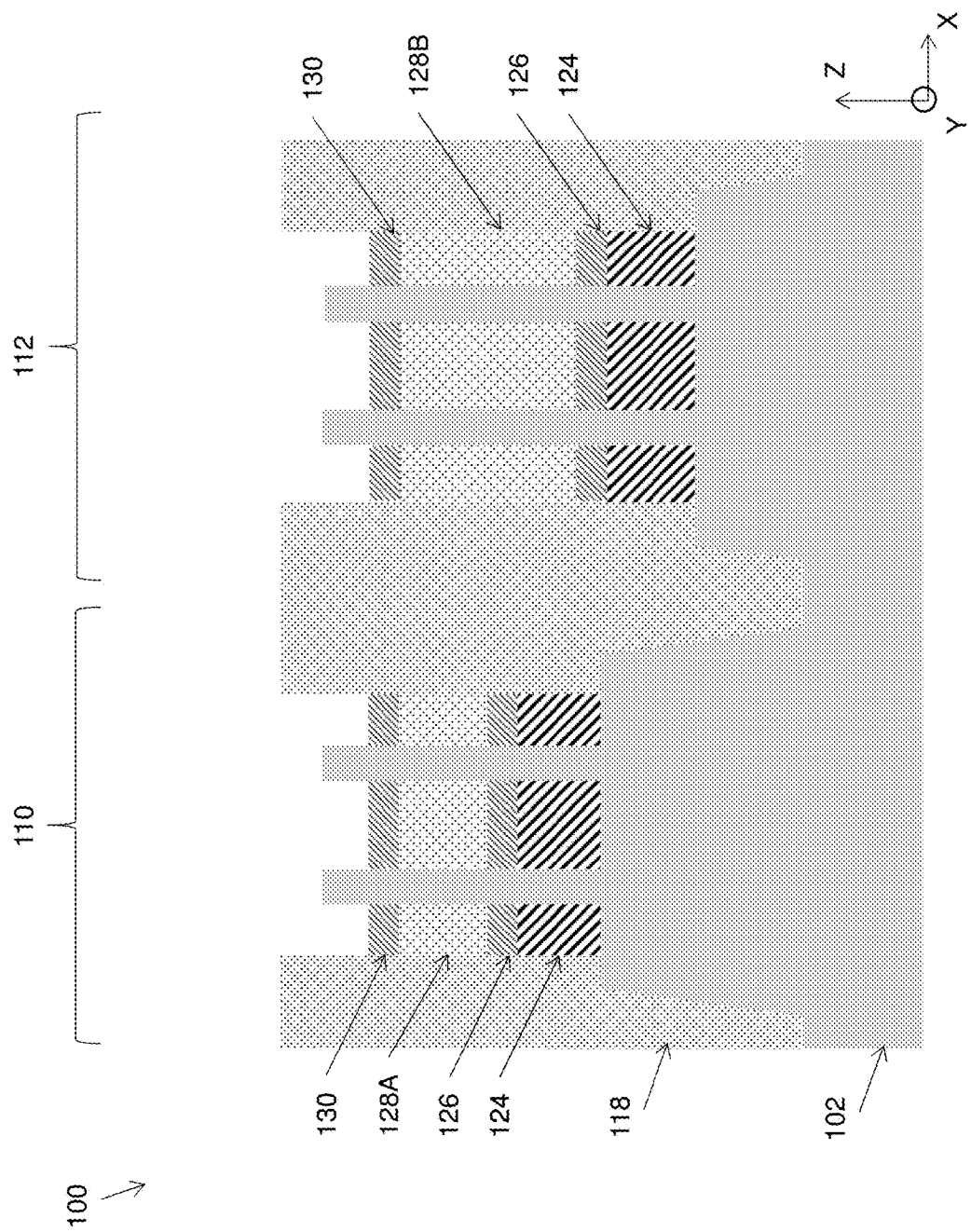
Figure 16:
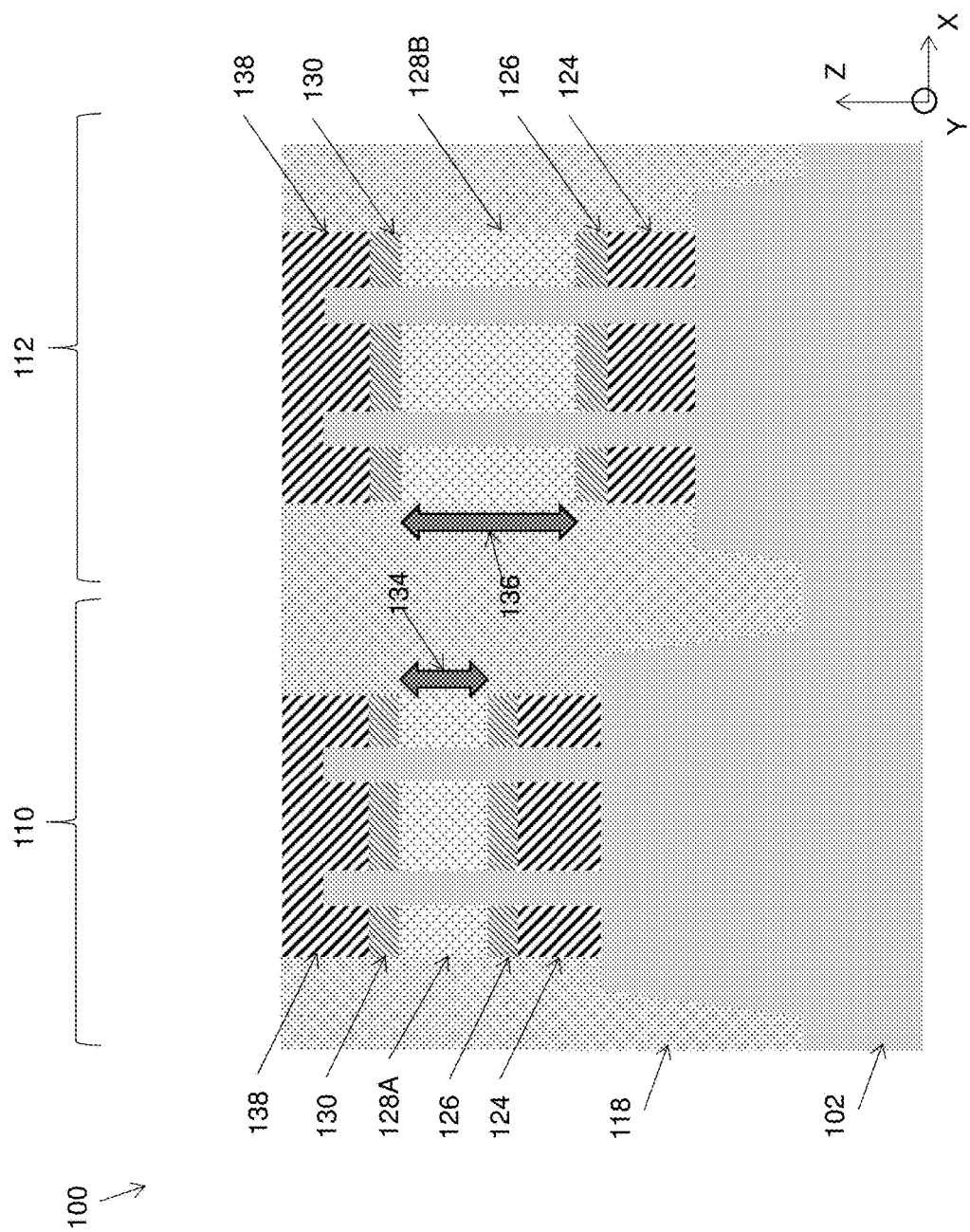

As depicted in FIG. 15, the sacrificial dielectric layers 132 and the hardmasks 104 have been removed by a selective etch process, thereby revealing the upper surfaces of the upper spacers 130 and the top portions of the fins 108. As shown in FIG. 16, doped semiconductor layers 138, which function as upper S/D regions 138, are epitaxially grown over the top portions of the fins 108 and the upper spacers 130. Upper S/D regions 138 encapsulates the top portions of the fins 108.

As depicted in FIG. 16, semiconductor structure 100 includes a short region gate height 134 and a long region gate height 136, where the short region gate height 134 is different than the long region gate height 136. As shown in FIG. 16, the S/D regions 124 and 138 have substantially the same thickness, respectively.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a vertical transistor, the method comprising:
    forming a first pair of fins on a substrate;
    forming a second pair of fins on the substrate, wherein the first pair of fins have no fins in common with the second pair of fins;
    forming a first trench in the substrate and interposed between each one of the first pair of fins;
    forming a second trench in the substrate and interposed between each one of the second pair of fins, wherein the second trench is deeper than the first trench;
    forming a first semiconductor structure in the first trench interposed between each one of the first pair of fins, the first semiconductor structure having a first gate region interposed between a first source region and a first drain region, wherein the first source region and the first drain region are separated from each other vertically with the first gate region therebetween; and
    forming a second semiconductor structure in the second trench interposed between each one of the second pair of fins, the second semiconductor structure having a first gate region interposed between a second source region and a second drain region, wherein the first gate region and the second gate region have different thicknesses from one another and the second source region and the second drain region are separated from each other vertically with the second gate region therebetween.

2. The method of claim 1, wherein the first semiconductor structure is formed at the same time as the second semiconductor structure.

3. The method of claim 1, wherein the first semiconductor structure has a different gate length than the second semiconductor structure.

4. The method of claim 3, wherein the gate of the first semiconductor structure and the gate of the second semiconductor structure are gate stacks.

5. The method of claim 1, wherein the first source region, the first drain region, the second source region, and the second drain region are uniform in thickness.

6. The method of claim 5, wherein a doped first source in the first source region, a doped first drain in the first drain region, a doped second source in the second source region, and a doped second drain in the second drain region are epitaxially grown to a uniform thickness.

7. The method of claim 1, wherein forming the first and second semiconductor structures comprises:
   depositing dielectric material around the first pair of vertical fins and the second pair of vertical fins; and
   selectively removing the dielectric material around the second pair of fins.

8. The method of claim 7, wherein selectively removing the dielectric material comprises removing the dielectric material to form a void around the first pair of fins and the second pair of fins.

9. The method of claim 8, wherein the void around the second pair of fins is deeper than the void around the second pair of fins.

10. A vertical transistor comprising:
   a first pair of fins on a substrate;
   a second pair of fins on the substrate, wherein the first pair of fins have no fins in common with the second pair of fins;
   a first trench in the substrate and interposed between each one of the first pair of fins;
   a second trench in the substrate and interposed between each one of the second pair of fins, wherein the second trench is deeper than the first trench;
   a first semiconductor structure in the first trench interposed between one of the first pair of fins, the first semiconductor structure having a first gate region interposed between a first source region and a first drain region, wherein the first source region and the first drain region are separated from each other vertically with the first gate region therebetween; and
   a second semiconductor structure in the second trench, which is deeper than the first trench, interposed between each one of the second pair of fins, the second semiconductor structure having a first gate region interposed between a second source region and a second drain region, wherein the first gate region and the second gate region have different thicknesses from one another, wherein the second source region and the second drain region are separated from each other vertically with the second gate region therebetween.

11. The vertical transistor of claim 10, wherein the first semiconductor structure is formed at the same time as the second semiconductor structure.

12. The vertical transistor of claim 10, wherein the first semiconductor structure has a different gate length than the second semiconductor structure.

13. The vertical transistor of claim 12, wherein the gate of the first semiconductor structure and the gate of the second semiconductor structure are gate stacks.

14. The vertical transistor of claim 10, wherein the first source region, the first drain region, the second source region, and the second drain region are uniform in thickness.

15. The vertical transistor of claim 14, wherein a doped first source in the first source region, a doped first drain in the first drain region, a doped second source in the second source region, and a doped second drain in the second drain region are epitaxially grown to a uniform thickness.

16. The vertical transistor of claim 10, wherein the first and second semiconductor structures comprise:
   a dielectric material deposited around the first pair of vertical fins and the second pair of vertical fins.

17. The vertical transistor of claim 16, wherein the dielectric material comprises a void around the first pair of fins and the second pair of fins.

18. The vertical transistor of claim 17, wherein the void around the second pair of fins is deeper than the void around the first pair of fins.

* * * * *